Sept. 16, 1969 R. WIESNER 3,466,741

METHOD OF PRODUCING INTEGRATED CIRCUITS AND THE LIKE

Filed May 5, 1966

United States Patent Office 3,466,741
Patented Sept. 16, 1969

3,466,741

METHOD OF PRODUCING INTEGRATED CIRCUITS AND THE LIKE

Richard Wiesner, Munich, Germany, assignor to Siemens Aktiengesellschaft, Berlin-Siemensstadt, Germany, a corporation of Germany Filed May 5, 1966, Ser. No. 547,990
Claims priority, application Germany, May 11, 1965, S 97,037
Int. Cl. B01j *17/00;* H05k *3/00*
U.S. Cl. 29—588 8 Claims

ABSTRACT OF THE DISCLOSURE

Described is a method for simultaneously producing a multiplicity of semiconductor circuit components, such as for microcircuits. The method comprises providing a semiconductor wafer on one face thereof with electrically functionary regions to ultimately function as respective semiconductor components. Grooves are then etched into said one wafer face thereby removing non-functionary material of the wafer. The wafer on the one face and on the surface of said grooves are provided with conductive electrical connections. Semiconductor material is then removed from the entire other face of said wafer until the resulting wafer pieces containing said functionary regions are mechanically interconnected only by the network formed of the totality of said electrical interconnections and terminal connections. The resulting interspaces are filled with solidifying insulating material.

My invention relates to a method of producing microcircuits and other integrated circuits or the like complexes of semiconductor devices.

In such a complex, comprising a number of electrically active semiconductor components combined and interconnected on a single monocrystalline wafer of silicon or other semiconductor material, the insulation of the individual wafer regions that perform the electrical functions of these components poses a difficult problem. In electrical respects this problem can be solved satisfactorily with integrated circuits produced by the silicon planar technique, namely by first vapor-depositing conducting paths of gold between the individual regions that are to perform the function of semiconductor components, then electrolytically thickening the gold depositions, and thereafter eliminating those regions that would not perform an electrical function in the integrated circuit to be produced. Thereafter, the individual semiconductor pieces resulting from the method are connected with each other only by the thickened and strengthened conductive paths. This special method of insulation can prevent the occurrence of capacitive couplings and leakage currents between the electronically functionary regions due to the presence of insulating layers of air.

For simultaneously producing several hundred integrated circuits on a single semiconductor crystalline wafer, for example of silicon, it has been proposed to partly etch and thereby subdivide the wafer after the semiconductor components appertaining to the respective circuits have been produced by the conventional planar technique and after depositing the conducting paths interconnecting these components. Such subdivision by etching is done with the aid of a photomasking technique. Properly adjusting the masks requires exposure to infrared radiation, and the necessary manipulations must be carried out with the highly sensitive crystal wafers etched to very slight thickness.

It is an object of my invention to minimize the difficulties heretofore encountered with such methods of simultaneously producing a multiplicity of semiconductor integrated circuits and the like, in which the individual regions of respectively different conductivity (namely, specific resistance and/or type of conductance) are produced by doping with the aid of stencils and/or masks.

According to the invention, an essential portion of the ultimately functionary regions, namely those regions of the semiconductor crystal wafer that do not perform an electrical function in the integrated circuits to be produced, are eliminated by etching grooves into the side or face of the crystal where the electrically functionary regions are located, this side hereinafter being called front side. The groove etching may be effected either before or after producing the doped regions that are to perform the function of semiconductor components but must be done before providing the front side of the wafer with the required electrical interconnections between these functionary regions and the terminal connections that are to constitute the input and output leads of the circuits when completed. After the grooves are etched into the wafer and the interconnections and terminal connections are produced, the thickness of the semiconductor crystal wafer is reduced by eliminating material from the entire other side or face, preferably by an etching process. The latter removal of material from the back side is effected until the wafer is subdivided into semiconductor pieces containing the functionary regions so that these pieces are mechanically connected with each other only by the remaining network of the above-mentioned electrical connections.

As this method is being performed, the required etching depth up to the point of separation between the wafer pieces can be readily observed visually or also electrically. The depth of the grooves etched into the top face is about 10–50 micron, preferably about 25 micron.

According to another feature of our invention, the interspaces resulting from the removal of the non-functionary regions from between the functionary regions, are filled with an electrically insulating substance, preferably a substance resistant to the chemical agents used; and the required electrical connections between the functionary regions, as well as the input and output terminal connections, are likewise covered with electrically insulating material. As a result, the individual semiconductor pieces resulting from the removal of material from the back side of the semiconductor wafer are mechanically joined with each other by rigid insulating bridges. This greatly increases the stability of the integrated circuits so that the manipulation of these circuits during mounting or insertion into enclosures is considerably facilitated and the available possibilities of use are correspondingly increased.

Furthermore, masking the wafer front side with a casting or potting plastic facilitates performing the etching process on the back side of the wafer. The same expedient has the result of providing the integrated circuit with an envelope or housing of synthetic plastic, thus protecting the individual semiconductor components of the integrated circuit from ambient effects. The above-mentioned insulating bridges further provide for good thermal contact between the individual components.

Prior to etching material away from the entire back side of the crystal wafer, the wafer may be mounted face-to-face upon an acid-resistant carrier of material, such as glass. For example, the wafer may be glued onto the carrier. After etching the back side of the wafer in the above-described manner, it may be covered with an electrically insulating material, also as described, while still being mounted on the carrier. The carrier is subsequently removed after hardening of the electrical insulating material.

In view of the generally excellent insulation and mechanical strength attainable by hardenable casting or potting resins, the synthetic plastics used for enveloping the integrated circuits preferably constitute solid masses at the operating temperature of the finished integrated circuit. This applies, for example, to epoxide resins, silicone resins, or polyester resins.

According to still another feature of the invention, different synthetic plastics are employed on the two sides of the semiconductor wafer, the plastics differing from each other as to consistency and type. Preferably the casting mass used for covering the wafer front side where the functionary regions are located, is provided with admixtures of a kind having a favorable effect upon the electrical properties of the semiconductor devices constituted by these individual regions. Thus, when using the above-mentioned epoxide and other resins, it is advisable to add to the casting resin for the front side of the wafer, such oxides as CaO, $B_2O_3$, $CaSO_4$ acting as drying agents, or heat-dissipating substances such as $Al_2O_3$ or MgO. The addition to the casting mass may also comprise both kinds of additive components. By virtue of such additions, the thermal contact, already improved by the method of the invention can be appreciably increased to a further extent.

The above-mentioned filling of the interstices by casting or potting resin, as well as the enveloping of the electrical connections between the electrically functionary regions and the connection serving as input and output terminals, may be facilitated by employing a mold body to be removed after curing and hardening of the synthetic plastic.

However, the mold body may also be such that it serves not only as a casting or pressing mold, but also as a housing component which remains joined with the semiconductor integrated circuits after completion of the latter. In this case, the material of the mold body may be adapted to that of the casting resin used. In other words, the mold body may also be made of casting or potting resin. The individual or integrated circuits are then ultimately obtained by subdividing the wafer after hardening of the synthetic plastic, the connections serving as input and output terminals remaining free of casting mass so that they are accessible from the outside.

The invention will be further described with reference to an embodiment illustrated by way of example on the accompanying drawing in which.

The same reference characters are applied in all of the illustrations for corresponding items respectively.

Figure 1:
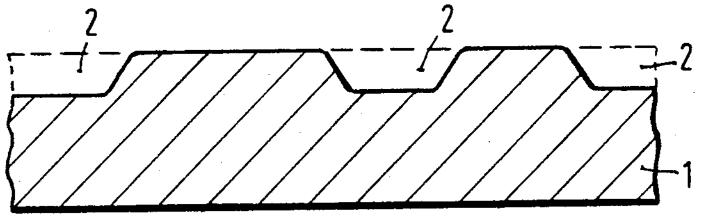
FIG. 1 shows schematically a longitudinal section of part of a silicon wafer in a first stage of the method according to the invention.

The wafer 1 shown in FIG. 1 consists of monocrystalline silicon and has a thickness of 100–200 micron. At some localities a number of grooves 2 having a depth of 10–50 micron are etched into the front face by the conventional photo-technique on the wafer side at which subsequently those regions are located that are to perform the function of electrical semiconductor devices. The wafer 1, for example, may have circular shape of about 25 mm. diameter and the above-mentioned thickness of about 100–200 micron, for accommodating several hundred integrated microcircuits.

Figure 2:
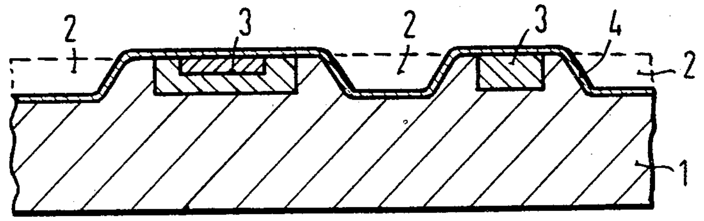
FIGS. 2, 3 and 4 illustrate the same sectional portion of the wafer in respective subsequent stages of manufacture.

After etching the grooves 2, the conventional planar technique is applied for producing on the grooved front side of the wafer at the proper localities a number of doping the regions 3 into the wafer, the front surface is the particular circuitry to be produced. Two of the doped regions are denoted by 3 in FIG. 2. In the completed microcircuits, these regions are to be electrically functionary, that is, they are to constitute the individual semiconductor components or devices of the circuits. After doping the regions 3 into the wafer, the front surface is oxidized and thus coated with a layer 4 of silicon dioxide.

Figure 3:
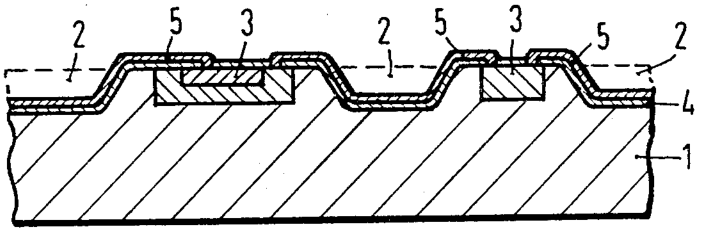

As shown in FIG. 3, the individual regions 3 are thereafter interconnected by strip-shaped depositions of gold 5 having a thickness of 10–50 micron and a width of approximately 100 micron. In this manner the integrated circuits are formed on the wafer 1 (FIG. 3). The conducting gold strips 5 also form the electrical terminal connections or leads of these circuits, which in each completed circuit are to serve as input and output terminals. The conducting paths 5 are deposited onto the top surface, including that of the grooves 2, in the conventional manner, for example by vapor deposition, and are then electrolytically thickened and strengthened. The strips 5 in totality constitute a network of interconnections between the functionary regions 3 and the input and output terminals.

Figure 4:
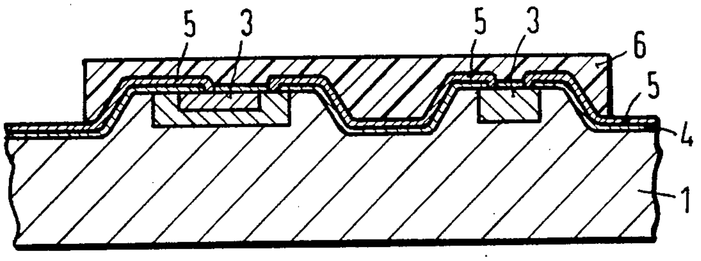

Now, according to FIG. 4, the recesses resulting from the etching of the grooves as well as the front surface of the functionary regions 3 and the interconnecting paths 5 are filled or covered by a synthetic plastic 6 in the nature of a casting or potting resin which is substantially resistant to chemical agents. Employed, for example, is an epoxide resin. This increases the mechanical stability of the integrated circuits to be produced and protect the functionary regions from ambient influences, particularly moisture, and it also improves the thermal contact or conductivity between the individual components of each integrated circuit so that the operating temperatures of the various circuit components do not excessively differ from each other. The synthetic plastic thus employed as casting resin is preferably provided with admixtures having a favorable effect upon the electrical properties of the functionary components. Employed, for example, are pulverulent oxides such as $B_2O_3$, CaO or $CaSO_4$ acting as dying agents. The casting masses may also be given a heat-dissipating addition such as pulverulent MgO or $Al_2O_3$.

After curing and hardening of the casting resin, the silicon crystalline wafer is reduced in thickness by eliminating material from the entire area of the back side, preferably by etching. Sufficient material is thus removed until the conducting paths 5 located in the etched grooves (2 in FIGS. 1 to 3) become visible from the back side. A suitable etchant is the conventional mixture of hydrofluoric acid and nitric acid in the ratio of 1:1. At normal room temperature (about 20° C.) the etching process is terminated in as little as about 5 to 7 minutes. For that reason, the casting mass 6 described above suffices for masking the side of the semiconductor wafer on which the functionary agents 3 and the electrical connections 5 are located.

Figure 5:
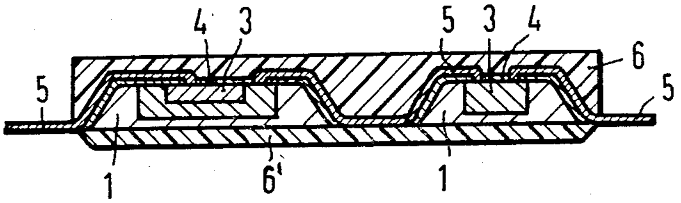
FIG. 5 illustrates a further stage of the same process.

After etching the back side, this side of the integrated circuits is likewise covered with hardenable casting resin 6' (FIG. 5) but the strip connections 5 that are to serve as input and output terminals are left free of casting mass.

As explained, the enveloping of the integrated circuits located on the silicon wafer, with hardenable casting or potting resin can be performed with the aid of a mold body which is either removed after curing and hardening of the synthetic plastic or which simultaneously serves as a constituent of the completed integrated circuit.

Figure 6:
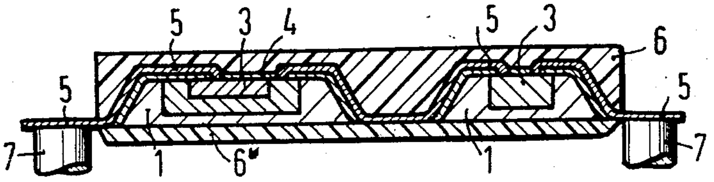
FIG. 6 shows in a corresponding longitudinal section the ultimate stage relating to the contacting of the terminal connections of one of the microcircuits produced.

Another advantage of the method according to the invention resides in the fact that the contacting of the input and output terminal connections on the completed integrated circuits can be effected from the back side of the circuits, for example, by thermocompression. FIG. 6 exemplifies this particularly favorable way of contacting an integrated circuit obtained by subdivision of a silicon crystalline wafer, described above with reference to FIGS. 1 to 5. The localities of the exposed conducting terminal strips 5 are such that the integrated circuit can be mounted on electrical connector pins 7 from the rear of the integrated circuit. Preferably the contacting and fastening is done by thermocompression.

The invention is not limited to the production of integrated semiconductor circuits, but also lends itself to producing other device complexes of silicon, germanium, or semiconductor compounds, particularly microcomponents such as silicon planar transistors or silicon planar diodes. In this case, many such devices or groups thereof may be located on a single semiconductor crystalline wafer, and are obtained after hardening of the casting mass by correspondingly subdividing the wafer. The invention then avoids or greatly minimizes the manipulating difficulties involved in contacting the semiconductor components, heretofore encountered with the conventional fabricating methods on account of the extremely small size of the individual components.

I claim:

1. The method of simultaneously producing a multiplicity of integrated circuits having a semiconductor crystal wafer with regions doped into the wafer at one face thereof and electrically functionary in each completed circuit, electrical interconnections between said functionary regions and input and output terminal connections, said method comprising the steps of etching grooves into said wafer face and thereby removing a portion of the nonfunctionary regions of the wafer, thereafter providing the wafer with said interconnections and said terminal connections on said face, mounting said wafer onto an acid-resistant carrier with said one wafer face attached to said carrier, then etching semiconductor material from the entire other face of said wafer until the resulting wafer pieces containing said functionary regions are mechanically interconnected only by the network formed of the totality of said electrical interconnections and terminal connections, covering the etched other face with electrically insulating synthetic plastic while the wafer remains attached to said carrier, and removing said carrier after hardening of said plastic.

2. The method of claim 1, wherein said grooves are etched down to a depth of about 10 to 50 micron.

3. The method of claim 1, wherein said grooves are etched down to a depth of about 25 micron.

4. The method of claim 1, wherein the removal of semiconductor material from the entire other face of said wafer is effected by etching down to a residual thickness of about 10 to 50 micron between said other face and said functionary regions.

5. The method of claim 1, which comprises subsequently covering front and back faces of the wafer with respectively different synthetic insulating materials.

6. The method of claim 5, wherein said synthetic insulating material for the front face, at which said electrically functionary regions are located, contains an admixture of metal oxide.

7. The method according to claim 6, wherein said oxide is magnesia or alumina.

8. The method of producing semiconductor circuit components, such as for microcircuits, which comprises providing a semiconductor wafer on one face thereof with electrically functionary regions to ultimately function as respective semiconductor components, then etching grooves into said one wafer face and thereby removing non-functionary material of the wafer, providing the wafer on said one face and on the surface of said grooves with conductive electrical connections, mounting said wafer onto an acid-resistant carrier with said one wafer face attached to said carrier, then removing semiconductor material from the entire other face of said wafer until the resulting wafer pieces containing said functionary regions are mechanically interconnected only by the network formed of the totality of said electrical interconnections and terminal connections, filling the resulting interspaces with solidifying insulating material, and removing said carrier after solidification of said insulating material.

References Cited

UNITED STATES PATENTS

| | | | |
|---|---|---|---|
| 3,074,145 | 1/1963 | Rowe | 29—578 |
| 3,158,788 | 11/1964 | Last. | |
| 3,206,647 | 9/1965 | Kahn. | |
| 3,290,753 | 12/1966 | Chang | 29—577 |
| 3,300,832 | 1/1967 | Cave | 29—580 |
| 3,307,239 | 3/1967 | Lepselter | 29—577 |

FOREIGN PATENTS

| | | |
|---|---|---|
| 1,188,731 | 3/1965 | Germany. |

PAUL M. COHEN, Primary Examiner

U.S. Cl. X.R.

29—577, 589; 148—1.5, 187